United States Patent
Lee

(10) Patent No.: US 9,818,737 B2
(45) Date of Patent: Nov. 14, 2017

(54) SEMICONDUCTOR DEVICE AND METHOD OF MANUFACTURING THE SAME

(71) Applicant: SK hynix Inc., Icheon-si Gyeonggi-do (KR)

(72) Inventor: Hyun Ho Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/791,680

(22) Filed: Jul. 6, 2015

(65) Prior Publication Data
US 2016/0225697 A1 Aug. 4, 2016

(30) Foreign Application Priority Data
Feb. 2, 2015 (KR) .................. 10-2015-0016247

(51) Int. Cl.
| | | |
|---|---|---|
| H01L 23/498 | (2006.01) | |
| H01L 21/48 | (2006.01) | |
| H01L 27/02 | (2006.01) | |
| H01L 21/768 | (2006.01) | |
| H01L 27/11582 | (2017.01) | |
| H01L 27/11556 | (2017.01) | |

(52) U.S. Cl.
CPC .... *H01L 27/0207* (2013.01); *H01L 27/11582* (2013.01); *H01L 27/11556* (2013.01)

(58) Field of Classification Search
None
See application file for complete search history.

(56) References Cited

U.S. PATENT DOCUMENTS

| | | | | |
|---|---|---|---|---|
| 6,707,113 B1* | 3/2004 | Kobayashi | ........ | H01L 21/28273 257/314 |
| 2008/0067583 A1* | 3/2008 | Kidoh | ................. | H01L 21/8221 257/326 |
| 2008/0265235 A1* | 10/2008 | Kamigaichi | ........ | H01L 27/2409 257/2 |
| 2009/0146206 A1* | 6/2009 | Fukuzumi | ........... | H01L 21/8221 257/324 |
| 2011/0076819 A1* | 3/2011 | Kim | .................. | H01L 27/11551 438/279 |

(Continued)

FOREIGN PATENT DOCUMENTS

| | | |
|---|---|---|
| KR | 1020100097459 A | 9/2010 |
| KR | 1020110001527 A | 1/2011 |

*Primary Examiner* — Michael Lebentritt
*Assistant Examiner* — Jordan Klein
(74) *Attorney, Agent, or Firm* — William Park & Associates Ltd.

(57) ABSTRACT

A semiconductor device is provided. The semiconductor device may include stacks including conductive layers and insulating layers. The conductive layers and insulating layers may be alternately stacked. The semiconductor device may include semiconductor patterns passing through the stacks. The semiconductor device may include plug patterns located on the semiconductor patterns and protruding compared to the stacks. The semiconductor device may include insulating patterns located on the stacks and the plug patterns and each including an edge area having a height at a level lower than a central area. The semiconductor device may include slit insulating layers located between the stacks and between the insulating patterns.

13 Claims, 12 Drawing Sheets

(56) References Cited

U.S. PATENT DOCUMENTS

| | | | |
|---|---|---|---|
| 2011/0193153 A1* | 8/2011 | Higuchi | H01L 27/11578 257/324 |
| 2012/0070944 A1* | 3/2012 | Kim | H01L 27/0688 438/128 |
| 2013/0270714 A1* | 10/2013 | Lee | H01L 21/76802 257/774 |
| 2014/0054787 A1* | 2/2014 | Eun | H01L 27/2481 257/773 |
| 2014/0197481 A1* | 7/2014 | Hwang | H01L 29/66833 257/330 |
| 2014/0252363 A1* | 9/2014 | Liu | H01L 27/11556 257/66 |
| 2015/0041903 A1* | 2/2015 | Oh | H01L 21/28008 257/368 |

* cited by examiner

SEMICONDUCTOR DEVICE AND METHOD OF MANUFACTURING THE SAME

CROSS-REFERENCE TO RELATED APPLICATION

The present application claims priority to Korean patent application number 10-2015-0016247 filed on Feb. 2, 2015, in the Korean Intellectual Property Office, the entire disclosure of which is incorporated by reference herein.

BACKGROUND

1. Technical Field

Various embodiments generally relate to an electronic device and a method of manufacturing the same. More particularly, the various embodiments relate to a semiconductor device having a 3-dimensional structure and a method of manufacturing the same.

2. Related Art

Memory devices that are non-volatile memory devices maintain stored data even when the power supply to the memory device is cut off. 2-dimensional memory devices are formed with a single layer of memory cells on a silicon substrate. Recently, the degree of integration for 2-dimensional memory devices has reached a limit. Thus, 3-dimensional non-volatile memory devices including stacks of memory cells perpendicular to the silicon substrate have been proposed.

Existing 3-dimensional non-volatile memory devices are alternately stacked with sacrificial layers and insulating layers. Stacking the sacrificial layers and insulating layers in this way allows for simultaneously forming stacked memory cells by replacing the stacked sacrificial layers with conductive layers. However, a process of replacing the stacked sacrificial layers with conductive layers is not easy and a conductive material may remain in an undesired area in the process of the replacement. Furthermore, the remaining conductive material may be exposed in a subsequent process and may cause a chemical reaction. Accordingly, these problems may lead to reducing the yield of a manufacturing process, degrading the erase characteristics, and allow leakage current to occur.

SUMMARY

In an embodiment, there may be provided a semiconductor device. The semiconductor device may include stacks including conductive layers and insulating layers. The conductive layer and insulating layers may be alternately stacked. The semiconductor device may include semiconductor patterns passing through the stacks, plug patterns located on the semiconductor patterns and protruding compared to the stacks. The semiconductor device may include insulating patterns located on the stacks and the plug patterns and each including an edge area having a height at a level lower than a central area. The semiconductor device may include slit insulating layers located between the stacks and between the insulating patterns.

In an embodiment, there may be provided a method of manufacturing a semiconductor device. The method of manufacturing the semiconductor device including forming stacks including alternately stacked sacrificial layers and first insulating layers, forming second insulating layers on the stacks, and forming pillars passing through the second insulating layers and the stacks. The method of manufacturing the semiconductor device including forming a third insulating layer on the second insulating layers to cover the pillars, and forming first slits passing through the stacks, the second insulating layers and the third insulating layer. The method of manufacturing the semiconductor device including etching edge areas of the second insulating layers and the third insulating layer. The method of manufacturing the semiconductor device including forming a fourth insulating layer sealing uppermost parts of the first slits and including air gaps located in the first slits, and forming at least one second slit passing through the fourth insulating layer to open parts of the first slits. The method of manufacturing the semiconductor device including removing the sacrificial layers through the first slits and second slits, and forming conductive layers in areas where the sacrificial layers are removed.

In an embodiment, there may be provided a method of manufacturing a semiconductor device. The method of manufacturing the semiconductor device including alternately forming sacrificial layers and first insulating layers, and forming first slits passing through the sacrificial layers and the first insulating layers. The method of manufacturing the semiconductor device including extending widths of upper parts of the first slits, and forming second insulating layers on the sacrificial layers and the first insulating layers to seal the upper parts of the first slits. The method of manufacturing the semiconductor device including forming second slits passing through the second insulating layers to open parts of the first slits. The method of manufacturing the semiconductor device including removing the sacrificial layers through the first slits and the second slits, and forming conductive layers in areas where the sacrificial layers are removed.

DETAILED DESCRIPTION

Figure 1A:
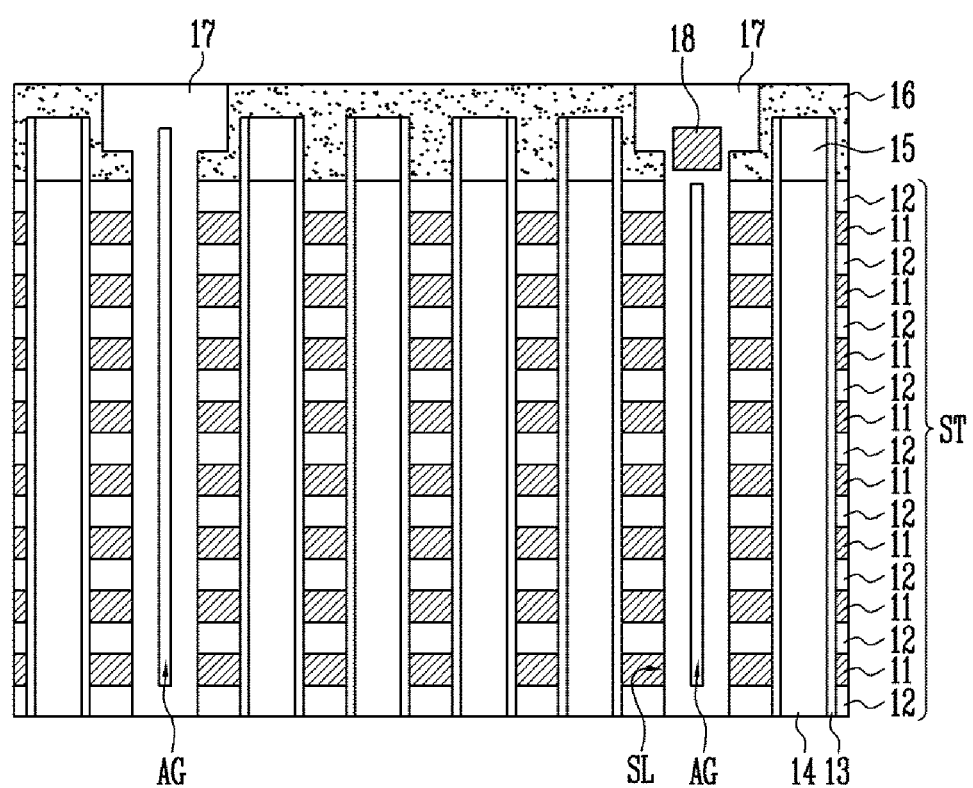
FIGS. 1A and 1B are cross-sectional views illustrating representations of examples of structures of a semiconductor device according to an embodiment.

Hereinafter, various embodiments will be described. In the drawings, the thicknesses and intervals of layers and regions are expressed for convenience of the descriptions, and may be exaggerated with respect to an actual physical thickness. In the descriptions, a well known structure, which is not related to the scope will be omitted. In adding reference numerals to elements of each drawing, like reference numerals refer to like elements throughout the different views.

An embodiment may improve a manufacturing process and may provide a semiconductor device having a stable structure and a method of manufacturing the same.

Figure 1B:
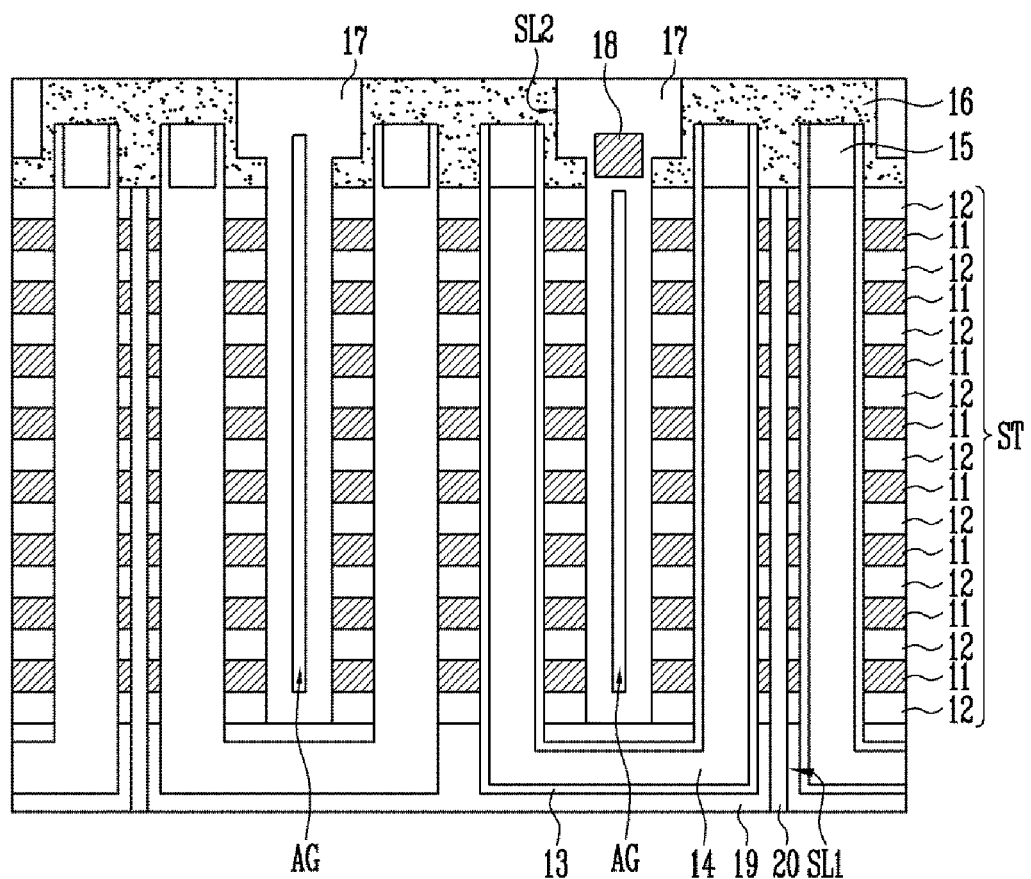

FIGS. 1A and 1B are cross-sectional views illustrating representations of examples of structures of a semiconductor device according to an embodiment.

Referring to FIGS. 1A and 1B, the semiconductor device according to an embodiment may include stacks ST, semiconductor patterns 14, and plug patterns 15. The semiconductor device may include insulation patterns 16 and slit insulating layers 17.

The stacks ST may include conductive layers 11 and insulating layers 12. The conductive layers 11 and insulating layers 12 may be alternately stacked. For example, the conductive layers 11 may be gate electrodes of select transistors, memory cells, etc., and the insulating layers 12 may be for insulating the stacked gate electrodes. For example, the conductive layers 11 may include a metal material such as titanium (Ti), tantalum (Ta), titanium nitride (TiN), tantalum nitride (TaN), tungsten (W), tungsten nitride (WNx), etc., and the insulating layers 12 may include an oxide, a nitride, etc.

The semiconductor patterns 14 pass through the stacks ST. The semiconductor patterns 14 may be channel layers of the select transistors, the memory cells, etc., and may include silicon (Si), germanium (Ge), etc. The semiconductor patterns 14 may include multiple forms. For example the semiconductor patterns 14 may be filled, open and not filled, or a combination including filled an not filled or open areas of the semiconductor patterns 14. For example the semiconductor patterns 14 may include a form which is completely filled up to a central area thereof. For example, the semiconductor patterns 14 may include a form in which the central area is open. For example, the semiconductor patterns 14 may include a form having a combination of filled and open central areas thereof. For example, the opened central area may be filled with the insulating layer.

Memory layers 13 are interposed between the semiconductor patterns 14 and conductive layers 11. For example, the memory layers 13 may have a form surrounding the semiconductor patterns 14. In this example, the memory layers 13 are interposed between the semiconductor patterns 14 and the conductive layers 11, and between the semiconductor patterns 14 and the insulating layers 12. In an example, the memory layers 13 may have a C-shape to surround respective conductive layers 11. In this example, the memory layers 13 are interposed between the semiconductor patterns 14 and the conductive layers 11, and between the conductive layers 11 and the insulating layers 12. It may be possible to form the memory layers 13 by combining the above two examples. The memory layers 13 may include a tunnel insulating layer, a data storage layer and a charge blocking layer. The data storage layer may include a silicon, a nitride, a nanodot, a phase change material, etc.

Memory strings may be disposed in various forms according to the forms of the semiconductor patterns 14. Referring to FIG. 1A, the semiconductor patterns 14 are disposed in a vertical form. For example, at least one uppermost conductive layer 11 may be a gate electrode of an upper select transistor, at least one lowest conductive layer 11 may be a gate electrode of a lower select transistor, and the remaining conductive layers 11 may be gate electrodes of the memory cells. For example, at least one lower select transistor, a plurality of memory cells and at least one upper select transistor are connected in series to form one memory string, and the memory string may be disposed vertically. Referring to FIG. 1B, the semiconductor patterns 14 are disposed in a U-shape. For example, at least one uppermost conductive layer 11 may be the gate electrode of the select transistor and the remaining conductive layers 11 may be the gate electrodes of the memory cells. For example, a pipe gate 19 may be a gate electrode of a pipe transistor. For example, at least one first select transistor, the plurality of the memory cells, the pipe transistor and at least one second select transistor are connected in series to form one memory string, and the memory string may be disposed in a U-shape.

The plug patterns 15 may be located on the semiconductor patterns 14 and may protrude compared to the stacks ST. The plug patterns 15 may be electrically connected or electrically coupled to the semiconductor patterns 14 and may be located in the memory layers 13. For example, the semiconductor patterns 14 and plug patterns 15 mutually connected may have a pillar shape. For example, the plug patterns 15 include polysilicon layers.

The insulating patterns 16 may be located on the stacks ST and the plug patterns 15. Edge areas of the insulating patterns 16 may have heights at levels lower than central areas of the insulating patterns. For example, sidewalls of the insulating pattern 16 may have a step-shape. For example, the edge areas have heights lower than the central areas so that an upper part of a slit SL may have a width greater than a lower part of the slit SL (i.e., see FIGS. 1A and 1B).

Slits SL, SL1, and SL2 may be located between the stacks ST and the insulating patterns 16. For example, locations and intervals of the slits SL, SL1, and SL2 may be determined according to the number of the memory strings sharing a word line. For example, referring to FIG. 1A, at least four memory strings may be disposed in one direction between adjacent slits SL. For example, the slits SL may be formed in various locations and may form according to forms of the semiconductor patterns 14. For example, referring to FIG. 1B, when the semiconductor patterns 14 have a U-shape, a second slit SL2 is located between vertical patterns included in one semiconductor pattern 14 and a first slit SL1 is located between adjacent semiconductor patterns 14.

Slit insulating layers 17 and 20 are located in the slits SL, SL1, and SL2. For example, referring to FIG. 1B, the slit insulating layers 20 formed in the first slits SL1 may be connected to the insulating patterns 16. For example, referring to FIG. 1B, the slit insulating layers 20 (i.e., other slit insulating layers) may be formed in the first slits SL1 and may have an upper surface connected to the insulating patterns 16. For example, referring to FIG. 1B, the slit insulating layers 20 (i.e., other slit insulating layers) may be formed in the first slits SL1 and may have an upper surface connected to the insulating patterns 16 and substantially in-line with the central area of the insulating patterns 16.

The slit insulating layers 17 and 20 may include an oxide, a nitride, etc. The slit insulating layers 17 and 20 may include air gaps AG, and the air gaps AG included in the slit insulating layers 17 and 20 may be located at different heights.

For example, the slit insulating layers 17 may include metal residues 18. The metal residues 18 may include a material identical to the conductive layers 11. The metal residues 18 may include a material substantially identical to the conductive layers 11. Since the metal residues 18 are located in the slit insulating layers 17, the metal residues 18 are not externally exposed. For example, the metal residues 18 may be located at levels lower than upper surfaces of the insulating patterns 16 or may be located at levels lower than upper surfaces of the plug patterns 15.

According to the above-described structure, since the metal residues 18 located inside of the slit insulating layer 17 may not be externally exposed, an explosion generated by a reaction between the metal residues 18 and chemical gas may be prevented. Accordingly, degradation of an erase characteristic and generation of leakage current may be prevented.

FIGS. 2A to 2J cross-sectional views illustrating representations of examples of methods of manufacturing the semiconductor device according to an embodiment.

Figure 2A:
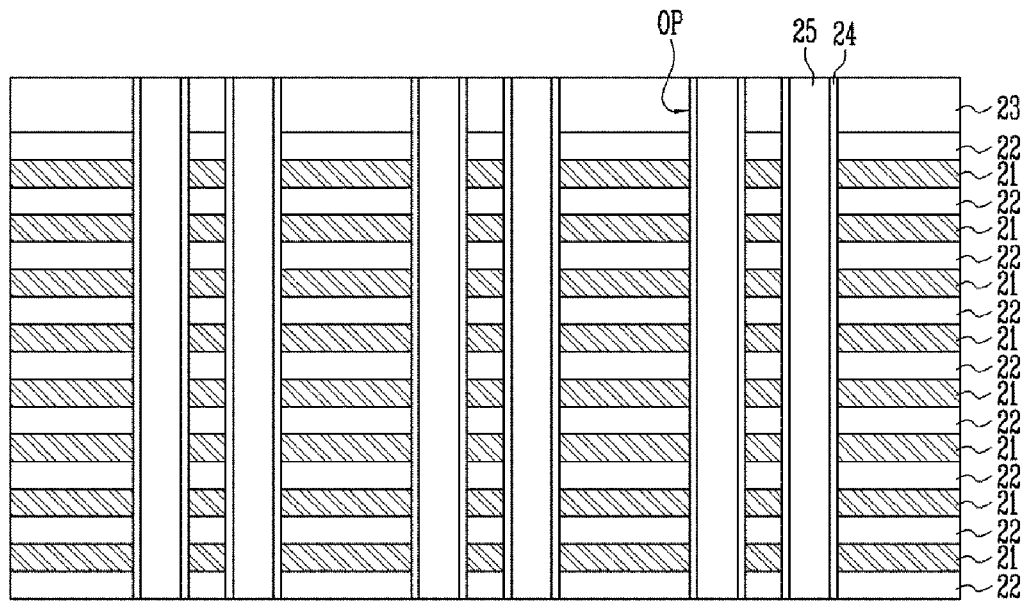
FIGS. 2A to 2J are cross-sectional views illustrating representations of examples of methods of manufacturing the semiconductor device according to an embodiment.

Referring to FIG. 2A, sacrificial layers 21 and first insulating layers 22 may be alternately formed. For example, the sacrificial layers 21 may be formed of a material having a higher etch selectivity with respect to the first insulating layers 22. For example, the sacrificial layers 21 may include a nitride and the first insulating layers 22 may include an oxide. For example, the sacrificial layers 21 may include an oxide and the first insulating layers 22 may include a nitride.

The sacrificial layers 21 and the first insulating layers 22 may be formed with identical or different thicknesses. A thickness of the first insulating layer 22 located on an uppermost layer may be formed to be greater than that of the remaining first insulating layers 22. The first insulting layer 22 may be used as a hard mask in a subsequent process. In an embodiment, second insulating layers 23 for the hard mask may be formed on the sacrificial layers 21 and the first insulating layers 22. For example, the second insulating layers 23 may include an oxide.

Subsequently, openings OP passing through the second insulating layers 23, the sacrificial layers 21 and the first insulating layers 22 are formed. Then memory layers 24 and semiconductor patterns 25 may be formed in the openings OP. For example, the memory layers 24 may be formed to surround each of the semiconductor patterns 25 or substantially surround each of the semiconductor patterns 25.

Figure 2B:
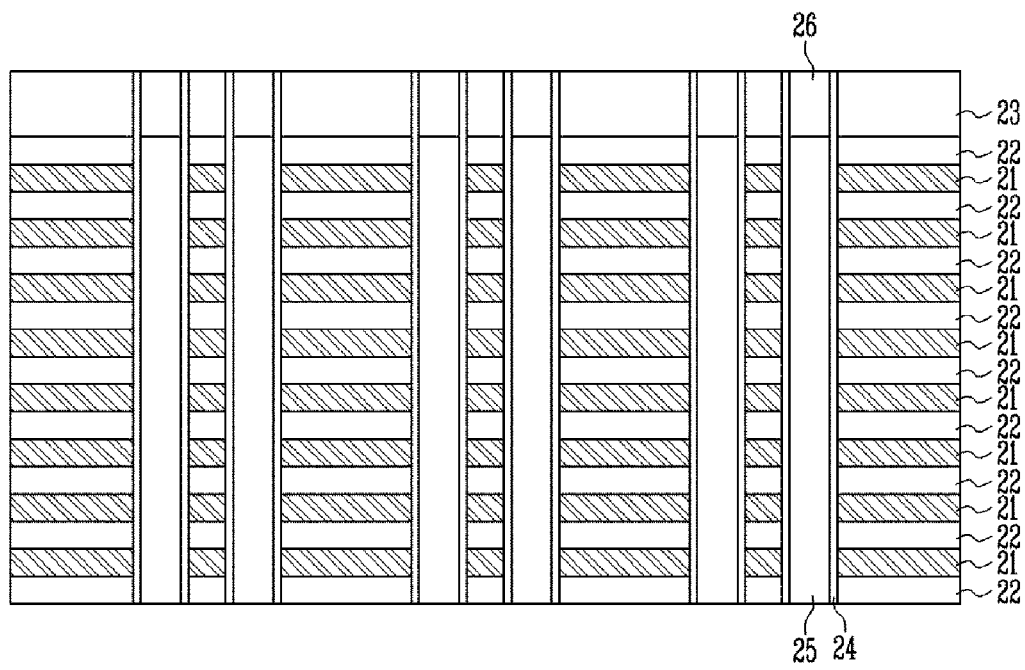

Referring to FIG. 2B, certain depths of the semiconductor patterns 25 are removed to reopen upper parts of the openings OP. For example, only the semiconductor patterns 25 are etched to expose the memory layers 24, or the semiconductor patterns 25 and memory layers 24 may be etched.

Subsequently, plug patterns 26 may be formed in the reopened openings OP. The plug patterns 26 may be located on the semiconductor patterns 25 and may be electrically connected to the semiconductor patterns 25.

Figure 2C:
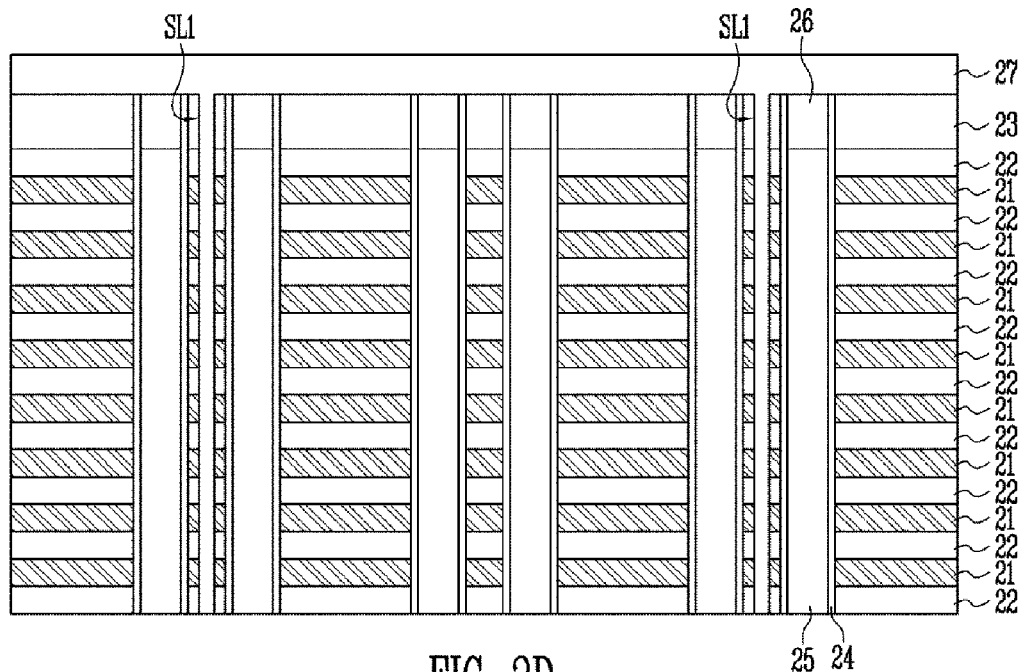

Referring to FIG. 2C, first slits SL1 located between the semiconductor patterns 25 and passing through the second insulating layers 23, sacrificial layers 21 and the first insulating layers 22, are formed. Subsequently, a third insulating layer 27 may be formed to fill first slits SL1. For example, the third insulating layer 27 may be formed inside of the first slits SL1 and on the second insulating layers 23. In an embodiment, the third insulating layer 27 may include an oxide.

Figure 2D:
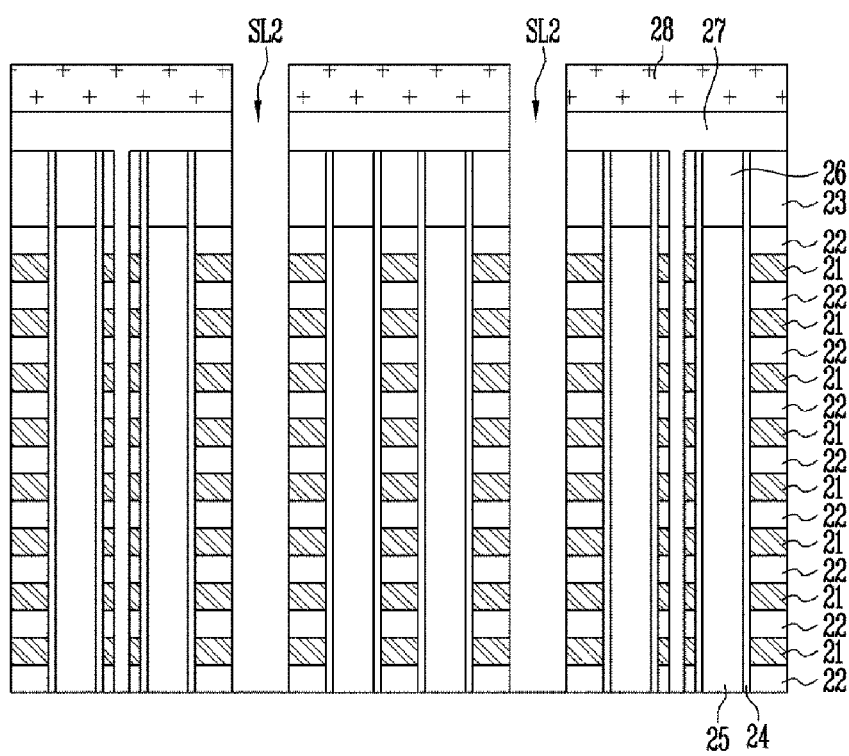

Referring to FIG. 2D, second slits SL2 passing through the third insulating layer 27, the second insulating layers 23, the sacrificial layers 21 and the first insulating layers 22, may be formed. For example, a first mask pattern 28 is formed on the third insulating layer 27, and then the third insulating layer 27, the second insulating layers 23, the sacrificial layers 21 and the first insulating layers 22 are etched using the first mask pattern 28 as an etching barrier. For example, the first mask pattern 28 includes openings in line-shapes exposing areas where the second slits SL2 are formed, and may have a form covering the semiconductor patterns 25 and plug patterns 26. In an embodiment, the second slits SL2 are formed to have a depth exposing all of the sacrificial layers 21.

Figure 2E:
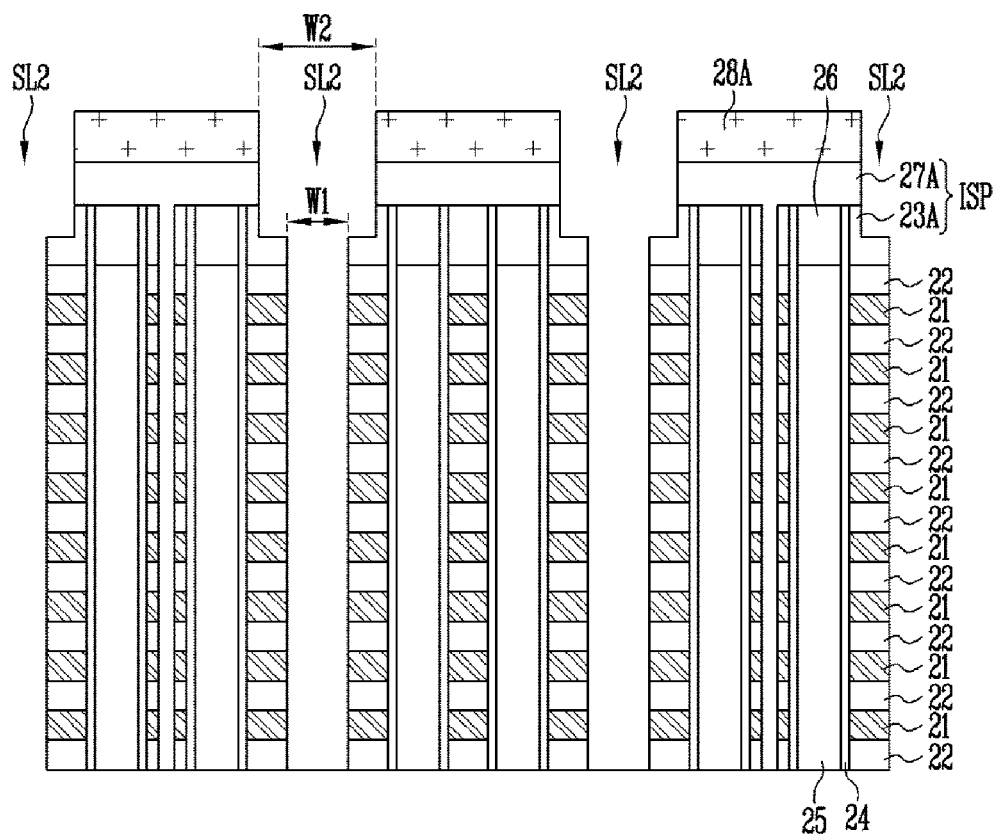

Referring to FIG. 2E, the first mask pattern 28 is shrunk to expose an edge area of a lower third insulating layer 27. Subsequently, the edge area of the third insulating layer 27 is etched using the shrunk mask pattern 28A as the etching barrier. At this time, a certain depth of the edge area of the third insulating layer 27 may be etched, or the second insulating layer 23 located under the third insulating layer 27 may also be etched. Thus, insulating patterns ISP including an insulating pattern 27A and a second insulating pattern 23A are formed, and each insulating pattern ISP has an edge area having a height at a level lower than a central area. Accordingly, an upper part of each SL2 has a width greater than a width of a lower part thereof (W2>W1). By repeatedly shrinking the first mask pattern 28A and etching the insulating pattern ISP, it may be patterned so that sidewalls of the insulating patterns ISP have a step-shape.

Figure 2F:
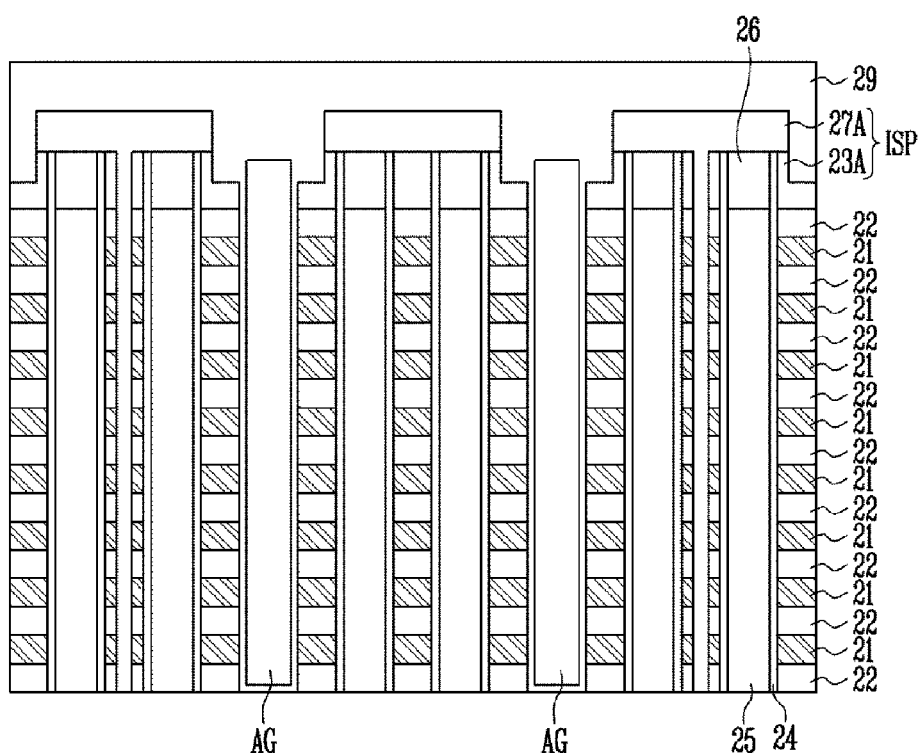

Referring to FIG. 2F, a fourth insulating layer 29 is formed after removing the first mask pattern 28A. The fourth insulating layer 29 may include an oxide. In an embodiment, the fourth insulating layer 29 may be formed on the insulating patterns ISP and formed in a part of the SL2. At this time, since there is a limitation on a deposition process, upper parts of the second slits SL2 may be sealed before lower parts of the second slits SL2 are completely filled. The fourth insulating layer 29 may include an empty space, i.e., an air gap AG, which is located in the second slit SL2.

Figure 2G:
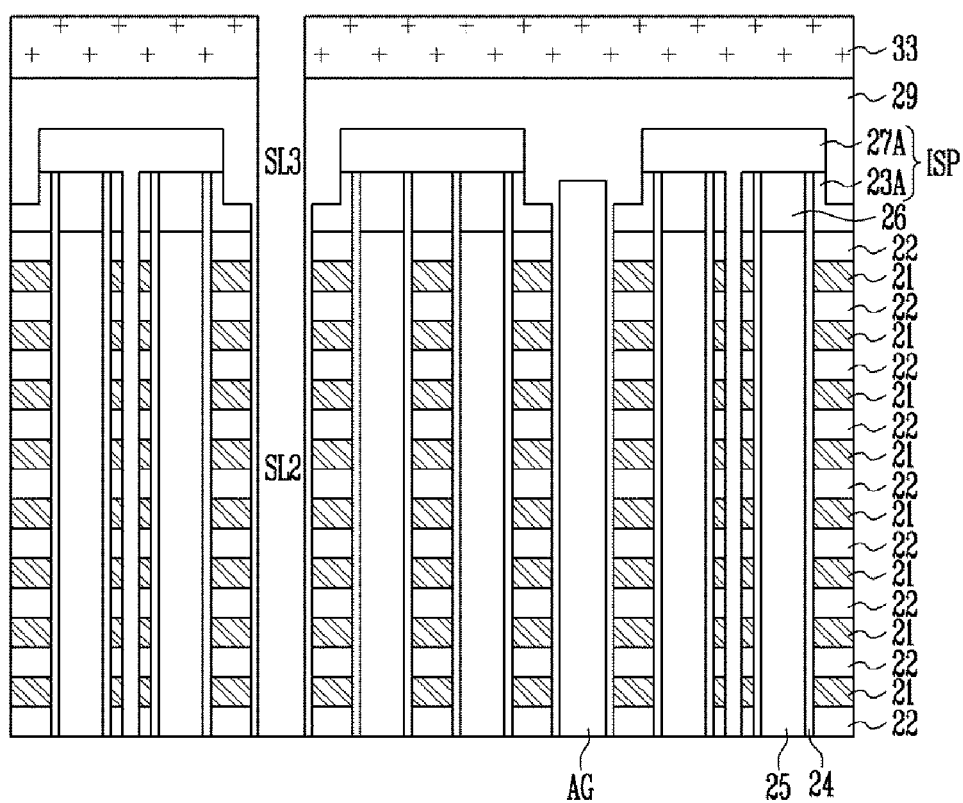

Referring to FIG. 2G, at least one third slit SL3 passing through the fourth insulating layer 29 and opening a part of the second slits SL2, is formed. For example, a second mask pattern 33 is formed on the fourth insulating layer 29. The second mask pattern 33 may include openings in an island shape. The openings may intermittently expose the second slits SL2. Subsequently, the third slit SL3 is formed by etching the fourth insulating layer 29 using the second mask pattern 33 as the etching barrier. At this time, the fourth insulating layer 29 may be etched to expose the air gap AG, and thus, parts of the second slits SL2 are reopened.

Figure 2H:
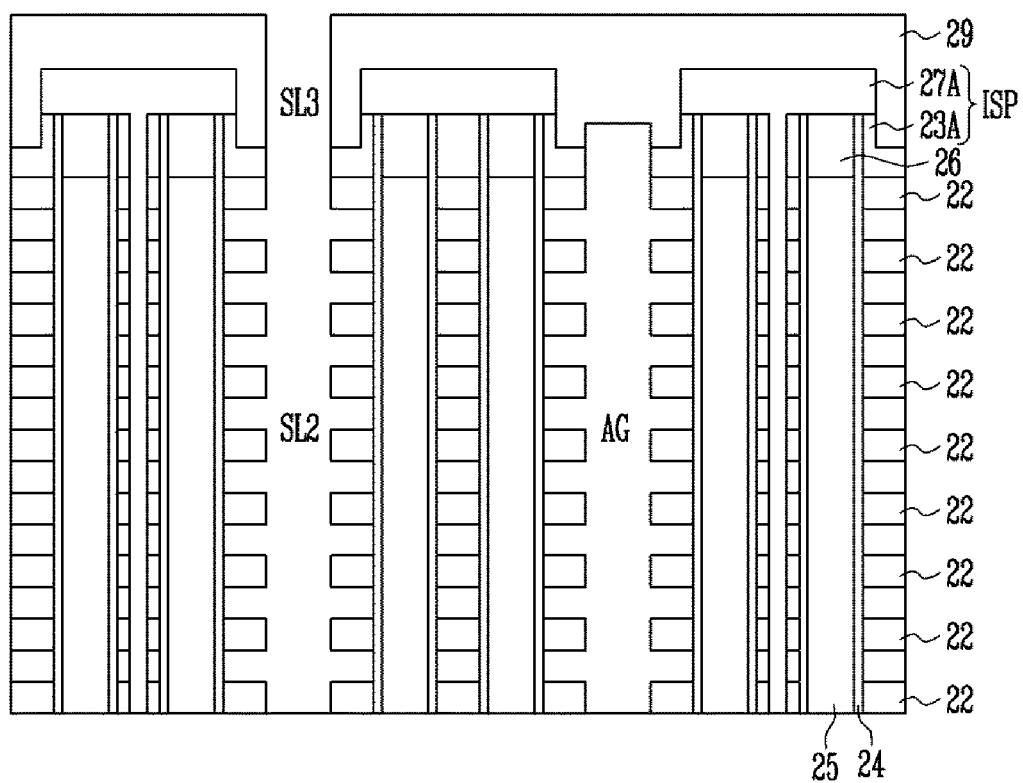

Referring to FIG. 2H, the second mask pattern 33 is removed, and the sacrificial layers 21 exposed through the second slits SL2 and the third slits SL3 are selectively removed. At this time, when the fourth insulating layer 29 remains in the second and third slits SL2 and SL3, the sacrificial layers 21 are removed after the sacrificial layers 21 are exposed by etching the fourth insulating layer 29.

For example, the third insulating pattern 27A formed in the first slits SL1 supports the remaining first insulating layers 22. Since an upper part of the stacks are fixed by the fourth insulating layer 29, the stacks may be prevented from slanting. Thus, the sacrificial layers may be selectively removed in a stable structure.

Figure 2I:
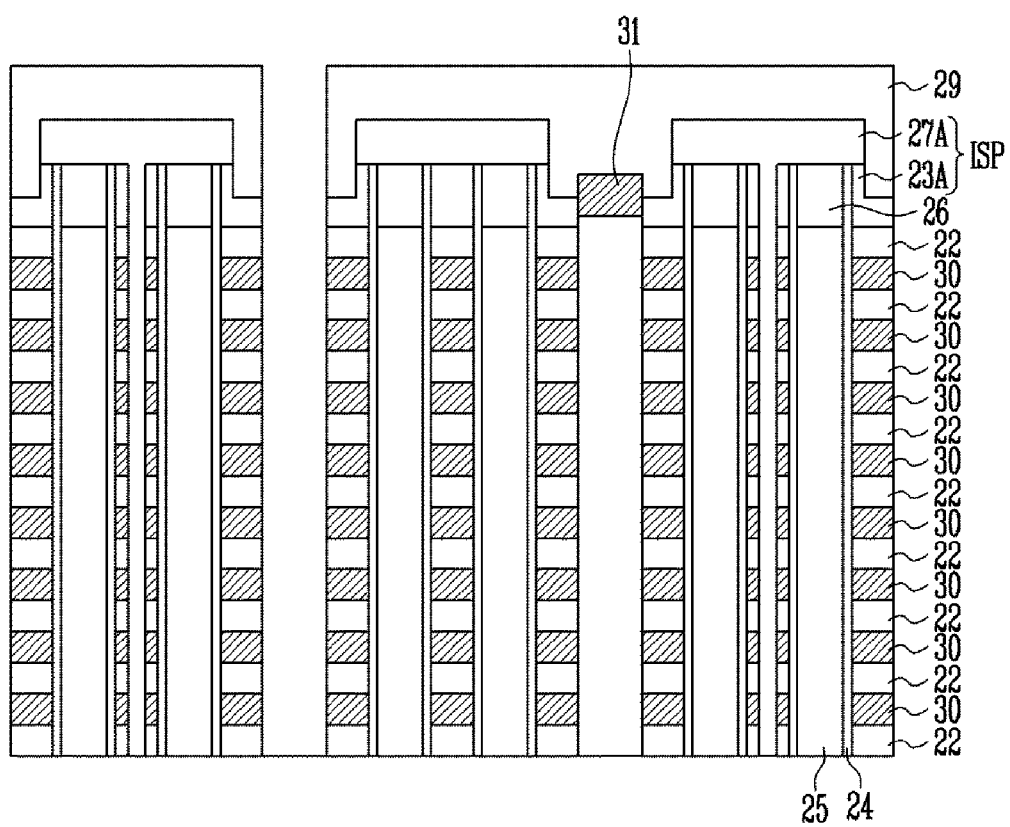

Referring to FIG. 2I, conductive layers 30 may be formed in areas where the sacrificial layers 21 are removed. For example, after forming a barrier layer along the entire surfaces of the areas where the sacrificial layers 21 are removed, a metal layer may be formed to fill the areas. For example, the barrier layer may include titanium (Ti), tantalum (Ta), titanium nitride (TiN), tantalum nitride (TaN), etc., and the metal layer may include tungsten (W) and tungsten nitride (WNx). Subsequently, stacked conductive layers 30 are separated from each other by removing the metal layer and the barrier layer formed in an inner wall of the second slits SL2. At this time, the metal layer formed on the uppermost part of air gap AG being in contact with the fourth insulating layer 29 is not removed, and thus metal residues 31 may remain in the air gap AG.

In an embodiment, before forming the conductive layers 30, it is possible to additionally form a memory layer in the areas where the sacrificial layers 21 are removed. The additionally formed memory layer may include at least one of a tunnel insulating layer, a data storage layer and a charge blocking layer.

Figure 2J:
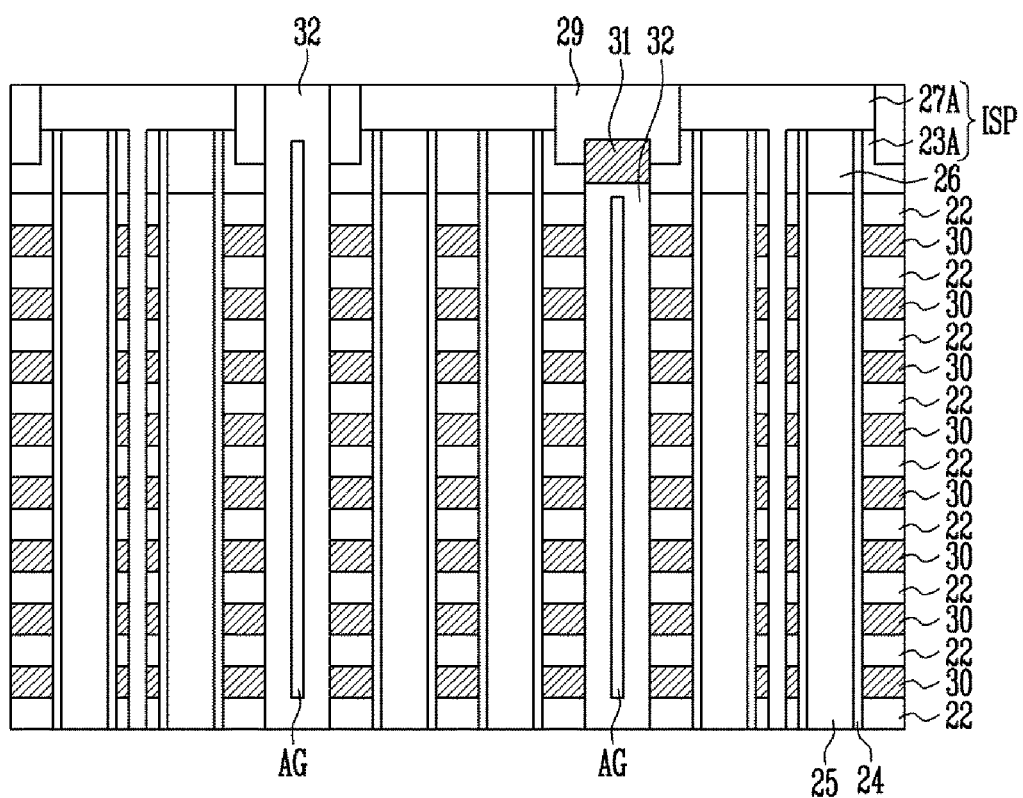

Referring to FIG. 2J, fifth insulating layers 32 may be formed. The fifth insulating layers 32 may be formed in the second slits SL2 and the third slits SL3 and on the fourth insulating layer 29. For example, each fifth insulating layer 32 may include an air gap AG. Subsequently, the fifth insulating layers 32 and the fourth insulating layer 29 are planarized to expose upper surfaces of the insulating patterns ISP. For example, metal residues 31 are located at levels lower than the upper surfaces of the insulating patterns ISP, or located at levels lower than upper surfaces of the plug patterns 26. Thus, the metal residues 31 are not externally exposed even when a planarizing process is performed. Also, since the fifth insulating layers 32 are formed in the second slits SL2 to surround lower parts of the metal residues 31, the metal residues 31 are not exposed to the air gap AG. Therefore, even when the metal residues 31 remain in the second slits SL2, the metal residues 31 are completely protected by an insulating material. Thus, an exposure of the metal residues 31 and a reaction between the metal residues 31 and chemical gas may be prevented.

The semiconductor device described with reference to FIG. 1B may be manufactured by applying the manufacturing method described above. For example, a trench may be formed by etching a conductive layer for a pipe gate, and then the trench is filled with a sacrificial layer. Subsequently, sacrificial layers and first insulating layers are alternately formed on the conductive layer for the pipe gate. Subsequently, openings are formed so that at least two openings are connected to one trench, and then the sacrificial layer in the trench is removed through the openings. Thus, openings in a U-shape are formed. Subsequently, memory layers and semiconductor patterns are formed in the openings. Subsequent processes may be performed in the same manner or substantially the same manner as described above.

Figure 3:
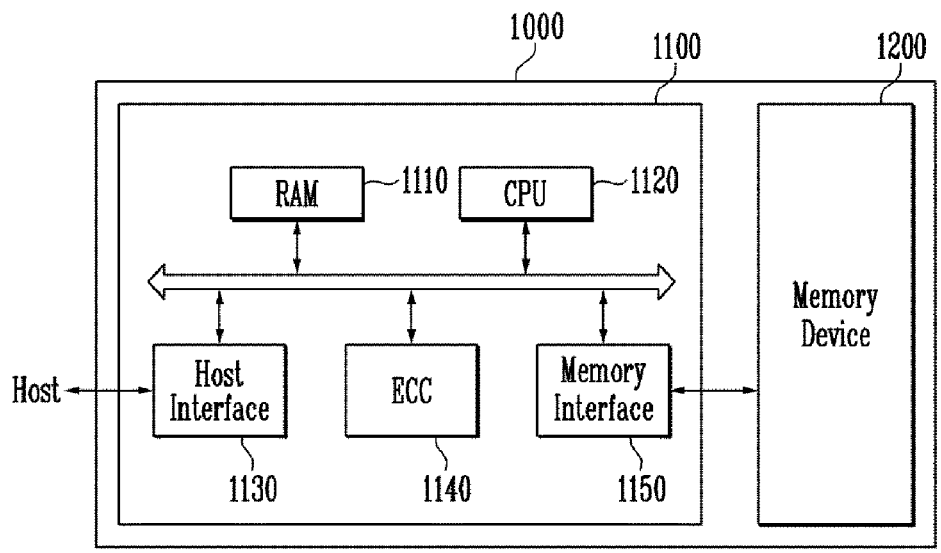
FIGS. 3 and 4 are block diagrams illustrating representations of examples of configurations of a memory system according to various embodiments.

FIG. 3 is a block diagram illustrating a representation of an example of a configuration of a memory system according to an embodiment.

Referring to FIG. 3, the memory system 1000 according to an embodiment may include a memory device 1200 and a controller 1100.

The memory device 1200 is used for storing data information having various data formats such as text, graphics, a software code, etc. The memory device 1200 may be a non-volatile memory and may include the structure described with reference to FIG. 1A to FIG. 2J. Furthermore, the memory device 1200 is configured to include stacks including conductive layers and insulating layers. The conductive layers and insulating layers may be alternately stacked. The memory device 1200 may include semiconductor patterns passing through the stacks. The memory device 1200 may include plug patterns located on the semiconductor patterns and protruding compared to the stacks. The memory device 1200 may include insulating patterns located on the stacks and the plug patterns, and each having an edge area having a lower height compared to a central area, and slit insulating layers located between the stacks and between the insulating patterns. Since a structure and manufacturing method of the memory device 1200 are the same as the above description, detailed descriptions are omitted.

The controller 1100 is connected to a host Host and the memory device 1200 and configured to access the memory device 1200 in response to a request from the host Host. For example, the controller 1100 is configured to control a read operation, a write operation, an erase operation, a background operation, etc. of the memory device 1200.

The controller 1100 includes a random access memory (RAM) 1110, a central processing unit (CPU) 1120, a host interface 1130, an error correction code (ECC) circuit 1140, a memory interface 1150, etc.

Here, the RAM 1110 may be used as an operational memory of the CPU 1120, a cache memory between the memory device 1200 and the host Host, a buffer memory between the memory device 1200 and the host Host, etc. For reference, the RAM 1110 may be replaced by a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The ECC circuit 1140 may be configured to detect and correct an error included in data read from the memory device 1200 using the ECC.

The memory interface 1150 may be configured to perform interfacing with the memory device 1200. For example, the memory interface 1150 includes a NAND interface or a NOR interface.

For reference, the controller 1100 may further include a buffer memory (not illustrated) for temporarily storing data. For example, the buffer memory may be used for temporarily storing data transmitted externally through the host interface 1130 or temporarily storing data transmitted from the memory device 1200 through the memory interface 1150. The controller 1100 may further include the ROM for storing code data for interfacing with the host Host.

Thus, since the memory system 1000 according to an embodiment may be easy to be manufactured and may include the memory device 1200 with a stabilized structure, a characteristic of the memory system 1000 may also be improved.

Figure 4:
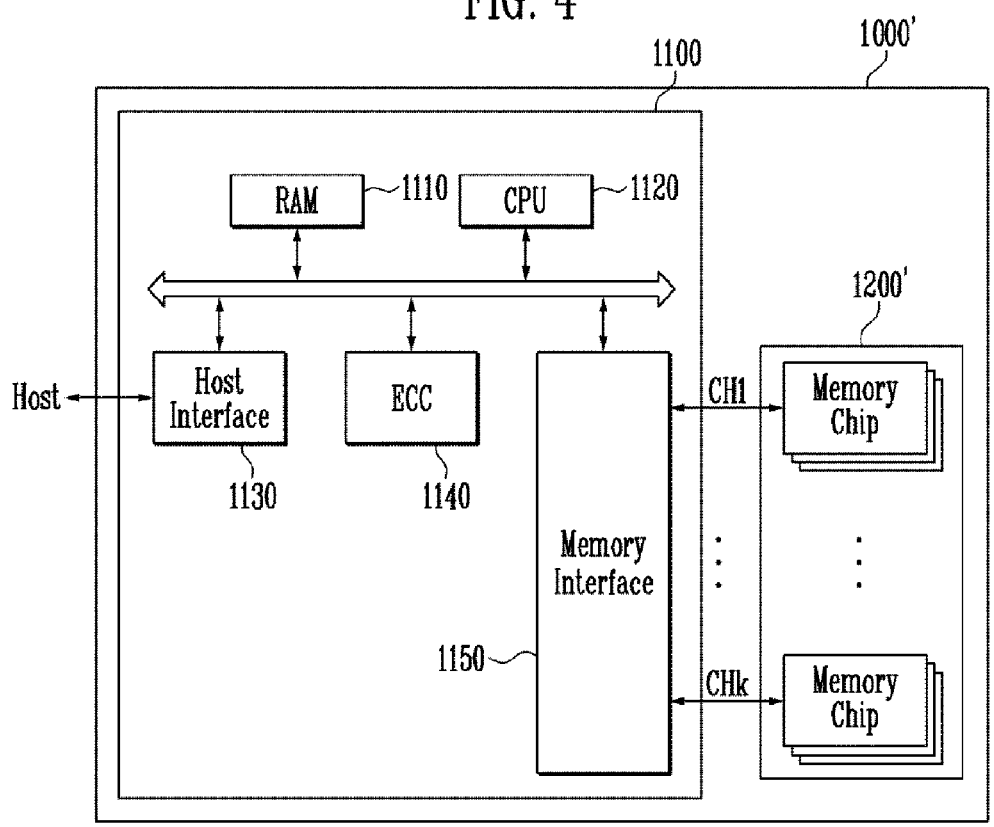

FIG. 4 is a block diagram illustrating a representation of an example of a configuration of a memory system according to an embodiment. Hereinafter, duplicated content of the content described above will be omitted.

Referring to FIG. 4, a memory system 1000' according to an embodiment may include a memory device 1200' and a controller 1100. Further, the controller 1100 includes a RAM 1110, a CPU 1120, a host interface 1130, an ECC circuit 1140, a memory interface 1150, etc.

The memory device 1200' may be a non-volatile memory and may include the memory string described with reference to FIG. 1A to FIG. 2J. For example, the memory device 1200' may be configured to include stacks including conductive layers and insulating layers. The conductive layers and insulating layers may be alternately stacked. The memory device 1200' may include semiconductor patterns passing through the stacks. The memory device 1200' may include plug patterns located on the semiconductor patterns and protruding compared to the stacks. The memory device 1200' may include insulating patterns located on the stacks and the plug patterns, and each having an edge area having a lower height compared to a central area. The memory device 1200' may include slit insulating layers located between the stacks and between the insulating patterns. Since a structure and manufacturing method of the memory device 1200' are the same as the above description, detailed descriptions are omitted.

Furthermore, the memory device 1200' may be a multi-chip package having a plurality of memory chips. The plurality of memory chips are divided into a plurality of groups, and the plurality of groups are configured to communicate with the controller 1100 through channels from first to k (CH1 to CHk). Also, the memory chips included in one group are configured to communicate with the controller 1100 through a common channel. For reference, it is possible to change the memory system 1000' so that one channel is connected to one memory chip.

Thus, since the memory system 1000' according to an embodiment may be easy to be manufactured and may include the memory device 1200' with a stabilized structure, the characteristics of the memory system 1000' may be also improved. In particular, since the memory device 1200' is formed in a multi-chip package, the data storage capacity of the memory system 1000' may be increased and a driving speed may be improved.

Figure 5:
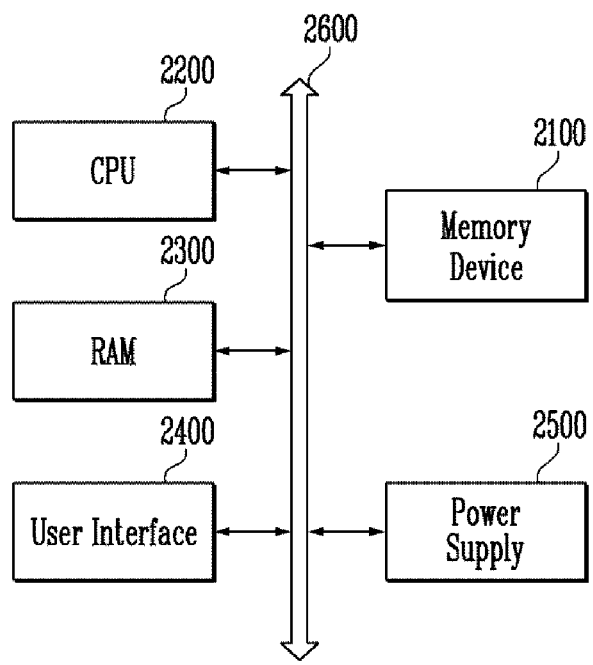
FIGS. 5 and 6 are block diagrams illustrating representations of examples of configurations of a computing system according to an embodiment.

FIG. 5 is a block diagram illustrating a representation of an example of a configuration of a computing system according to an embodiment. Hereinafter, duplicated content of the content described above will be omitted.

Referring to FIG. 5, the computing system 2000 according to an embodiment may include a memory device 2100, a CPU 2200, a RAM 2300, a user interface 2400, a power supply 2500, a system bus 2600, etc.

The memory device 2100 stores data transmitted through the user interface 2400 and data processed by the CPU 2200. Furthermore, the memory device 2100 is electrically connected to the CPU 2200, the RAM 2300, the user interface 2400, the power supply 2500, etc. through the system bus 2600. For example, the memory device 2100 may be connected to the system bus 2600 through a controller (not illustrated), or may be directly connected to the system bus 2600. When the memory device 2100 is directly connected to the system bus 2600, the CPU 2200, the RAM 2300, etc. may perform a function of the controller.

Here, the memory device 2100 may be a non-volatile memory and may include the memory string described with reference to FIG. 1A to FIG. 2J. For example, the memory device 2100 may be configured to include stacks including conductive layers and insulating layers. The conductive layers and insulating layers may be alternately stacked. The memory device 2100 may include semiconductor patterns passing through the stacks. The memory device 2100 may include plug patterns located on the semiconductor patterns and protruding compared to the stacks. The memory device 2100 may include insulating patterns located on the stacks and the plug patterns and each have an edge area having a lower height compared to a central area. The memory device 2100 may include slit insulating layers located between the stacks and between the insulating patterns. Since a structure and manufacturing method of the memory device 2100 are the same as the above description, detailed descriptions are omitted.

Furthermore, the memory device 2100 may be a multi-chip package having a plurality of memory chips, as described with reference to FIG. 4.

The computing system 2000 which has the above structure may be a ultra mobile personal computer (UMPC), a workstation, a net-book, a personal digital assistant (PDA), a portable computer, an web tablet, an wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device for transmitting and receiving information in an wireless environment, one of various electronic devices constituting a home network, one of various electronic devices constituting a computer network, one of various electronic devices constituting a telematics network, a radio frequency identification (RFID) device, etc.

Therefore, since the computing system 2000 according to an embodiment may be easy to be manufactured and may include the memory device 2100 with a stabilized structure, the characteristics of the computing system 2000 may also be improved.

Figure 6:
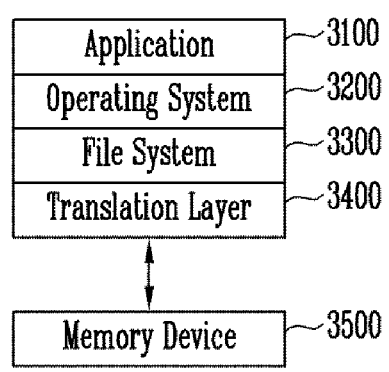

FIG. 6 is a block diagram illustrating a representation of an example of a computing system according to an embodiment.

Referring to FIG. 6, the computing system 3000 according to an embodiment may include a software layer including an operating system 3200, an application 3100, a file system 3300, a translation layer 3400, etc. Further, the computing system 3000 includes a hardware layer including a memory device 3500, etc.

The operating system 3200 manages software resources, hardware resources, etc. of the computing system 3000, and may control a program execution of a CPU. The application 3100 refers to various application programs executed in the computing system 3000 and may be a utility executed by the operating system 3200.

The file system 3300 refers to a logical structure for managing data, files, etc. existing in the computing system 3000, and systemizes files or data to be stored in the memory device 3500, etc. according to a rule. The file system 3300 may be determined according to the operating system 3200 used in the computing system 3000. For example, when the operating system 3200 is Windows of the Microsoft Corporation, the file system 3300 may be a file allocation table (FAT), a NT file system (NTFS), etc. Further, when the operating system 3200 is a Unix/Linux type, the file system 3300 may be an extended file system (EXT), a Unix file system (UFS), a journaled file system (JFS), etc.

Although the operating system 3200, the application 3100 and the file system 3300 are illustrated as separate blocks in the drawing, the application 3100 and the file system 3300 may be included in the operating system 3200.

The translation layer 3400 translates an address into a format suitable for the memory device 3500 in response to a request from the file system 3300. For example, the translation layer 3400 translates a logic address generated by the file system 3300 into a physical address of the memory device 3500. Here, mapping information of the logical address and physical address may be stored as an address translation table. For example, the translation layer 3400 may be the FTL, a universal flash storage link layer (ULL), etc.

The memory device 3500 may be a non-volatile memory and may include the memory string described with reference to FIG. 1A to FIG. 2J. For example, the memory device 3500 may be configured to include stacks including conductive layers and insulating layers. The conductive layers and insulting layers may be alternately stacked. The memory device 3500 may include semiconductor patterns passing through the stacks. The memory device 3500 may include plug patterns located on the semiconductor patterns and protruding compared to the stacks. The memory device 3500 may include insulating patterns located on an upper portion of the stacks and the plug patterns, and each having an edge area having a lower height compared to a central area. The memory device 3500 may include slit insulating layers located between the stacks and between the insulating patterns. Since a structure and manufacturing method of the memory device 3500 are the same as the above description, detailed descriptions are omitted.

The computing system 3000 having the above configuration may be classified into an operating system layer performed in a higher level area and a controller layer performed in a lower level area. Here, the application 3100, the operating system 3200 and the file system 3300 are included in the operating system layer, and may be driven by an operational memory of the computing system 3000. Also, the translation layer 3400 may be included in either the operating system layer or the controller layer.

Therefore, since the computing system 3000 according to an embodiment may be easy to be manufactured and may include the memory device 3500 with a stabilized structure, the characteristics of the computing system 3000 may also be improved.

A height of a metal residue remaining in a slit may be adjusted by extending an upper part of the slit to have a width wider than a lower part of the slit. Furthermore, exposure of the metal residues may be prevented in a subsequent process by protecting the metal residues with an insulating material. Thus, the metal residues may be prevented from being exposed to a chemical reaction, and thus a yield of a manufacturing process may be improved. Also, degradation of an erase characteristic and generation of leakage current may be prevented.

Although various examples of embodiments were discussed, it will be apparent to those skilled in the art that various modifications can be made to the above-described examples of embodiments without departing from the spirit or scope of the application.

What is claimed is:

1. A semiconductor device comprising:
   stacks including conductive layers and insulating layers, the conductive layers and insulating layers alternately stacked;
   semiconductor patterns configured to pass through the stacks;
   plug patterns located on the semiconductor patterns and configured to protrude compared to the stacks;
   insulating patterns located on the stacks and the plug patterns, and each insulating pattern including an edge area having a height at a level lower than a central area; and
   slit insulating layers located between the stacks and between the insulating patterns,
   wherein each of the insulating patterns is formed to surround side walls and upper portions of two or more plug patterns among the plug patterns, a lower side wall of each of the insulating patterns protrudes in a side direction more than an upper side wall, and the insulating patterns are formed in a single-layer structure.

2. The semiconductor device of claim 1, wherein sidewalls of insulating patterns have a step-shape.

3. The semiconductor device of claim 1, wherein at least one of the slit insulating layers has an upper part wider than a lower part.

4. The semiconductor device of claim 1, wherein at least one of the slit insulating layers includes an air gap.

5. The semiconductor device of claim 1, wherein at least one of the slit insulating layers includes a metal residue.

6. The semiconductor device of claim 5, wherein the metal residue is located at a level lower than upper surfaces of the insulating patterns.

7. The semiconductor device of claim 5, wherein the metal residue is located at a level lower than upper surfaces of the plug patterns.

8. The semiconductor device of claim 5, wherein the metal residue includes substantially the same material as the conductive layers.

9. The semiconductor device of claim 8,
   wherein the conductive layers include titanium (Ti), tantalum (Ta), titanium nitride (TiN), tantalum nitride (TaN), tungsten (W), or tungsten nitride (WNx), and
   wherein the insulating layers include either an oxide or a nitride.

10. The semiconductor device of claim 1, further comprising:
    a metal residue located inside at least one of the slit insulating layers.

11. The semiconductor device of claim 1, further comprising:
    at least one other slit insulating layer located between the stacks and including an upper surface connected to the insulating pattern.

12. The semiconductor device of claim 11, wherein the upper surface of the at least one other slit insulating layer is substantially in-line with the central area of an insulating pattern.

13. The semiconductor device of claim 11, wherein the semiconductor patterns are substantially U-shaped.

* * * * *